United States Patent [19]
Perera et al.

[11] Patent Number: 5,698,893
[45] Date of Patent: Dec. 16, 1997

[54] STATIC-RANDOM-ACCESS MEMORY CELL WITH TRENCH TRANSISTOR AND ENHANCED STABILITY

[75] Inventors: Asanga H. Perera; J. David Burnett, both of Austin, Tex.

[73] Assignee: Motorola, Inc., Schaumburg, Ill.

[21] Appl. No.: 367,632

[22] Filed: Jan. 3, 1995

[51] Int. Cl.$^6$ .................... H01L 29/04; H01L 21/20
[52] U.S. Cl. ............... 257/627; 257/903; 257/622; 437/93
[58] Field of Search ................ 257/627, 628, 257/903, 904, 622; 437/93

[56] References Cited

U.S. PATENT DOCUMENTS

| | | | |
|---|---|---|---|
| 3,860,948 | 1/1975 | Ono et al. | 257/627 |
| 4,603,473 | 8/1986 | Suemitsu | 29/578 |
| 4,794,561 | 12/1988 | Hsu | 257/903 |
| 4,890,144 | 12/1989 | Teng et al. | 257/903 |
| 5,171,703 | 12/1992 | Lin et al. | 437/61 |
| 5,285,093 | 2/1994 | Lage et al. | 257/903 |
| 5,324,960 | 6/1994 | Pfiester et al. | 257/903 |
| 5,384,473 | 1/1995 | Yoshikawa et al. | 257/627 |
| 5,416,736 | 5/1995 | Kosa et al. | 257/904 |

FOREIGN PATENT DOCUMENTS

| | | | |
|---|---|---|---|
| 354449 | 2/1990 | European Pat. Off. | H01L 29/04 |

OTHER PUBLICATIONS

Stiffler, et al.; "Oxidation-Induced Defect Generation in Advnaced DRAM Structures;" IEEE Trans. on Electron Devices; vol. 37; No. 5; pp. 1253–1257 (May 1990).

Construction Analysis of Samsung KM44C4100J-7 16-Meabit DRAM; Integrated Circuit Engineering Corp. (1961). Dec. 1991.

Wolf et al.; Silicon Processing for the VLSI Era; vol. 1; Lattice Press; p. 5 (1986). Dec. 1986.

Ghandhi; VLSI Fabrication, Principles; John Wiley & Sons; pp. 10–12 (1983). Dec. 1983.

Sze; VLSI Technology; Bell Telephone Laboratories, pp. 15, 461–465, and 601 (1983). Dec. 1983.

Sze; Physics of Semiconductor Devices; John Wiley & Sons; pp. 385386 (1981). Dec. 1981.

Colclaser; Microelectronics: Processing and Device Design; John Wiley & Sons; pp. 75, 255, and 263–264 (1980). Dec. 1980.

Yang; Fundamentals of Semiconductor Devices; McGraw-Hill Book Co.; pp. 210–211 (1978). Dec. 1978.

*Primary Examiner*—Mark V. Prenty
*Attorney, Agent, or Firm*—George R. Meyer

[57] ABSTRACT

A static-random-access memory (SRAM) cell has been devised which contains an access transistor having a first channel region with a first surface that lies along a first crystal plane; and a trench driver transistor having a second channel region with a second surface that lies along a second crystal plane. The first and second crystal planes belong to a single family of equivalent crystal planes, for example, the {100} family of planes. Orienting the surfaces of the channel regions of the two transistors in this fashion improves the beta ratio of the driver and access transistors and thus greatly improves the cell stability. The β ratio is the ratio of the transconductances of the driver and access MOSFETs, or $$\beta = \frac{G_{m-driver}}{G_{m-access}}$$

and preferably has a value of at least three. Using a trench driver transistor improves the bit cell capacitance.

8 Claims, 8 Drawing Sheets

STATIC-RANDOM-ACCESS MEMORY CELL WITH TRENCH TRANSISTOR AND ENHANCED STABILITY

FIELD OF THE INVENTION

The present invention relates to semiconductor devices, and in particular, to static-random-access memory cells having trench transistors and improved stability through alignment of the trench along certain semiconductor crystal planes.

BACKGROUND OF THE INVENTION

A bit cell in a Static-Random-Access Memory (SRAM) consists of six transistors or four transistors and two resistors connected as a flip-flop circuit. Shown in FIG. 1 is a four transistor, two resistor (4T-2R) SRAM bit cell 10 used in some of the latest SRAM integrated circuits. The cell consists of two high impedance polysilicon resistors R1 and R2, two access or transfer metal oxide semiconductor field effect transistors (MOSFETs) Q1 and Q4, and two pull-down or driver MOSFETs Q2 and Q3.

The transistors of the bit cell 10 are designed to prevent a read disturb error from occurring. To reduce the likelihood of a read disturb error, a beta ratio of at least three is desired. The beta ratio is the ratio of the transconductances of the driver and access MOSFETs, or $$\beta = \frac{G_{m-driver}}{G_{m-access}}$$

Attempts to improve the beta ratio have problems. A resistor may be placed between the access transistors and the storage nodes, but control of the resistance is difficult. In another attempt to improve the β ratio, the thickness of the gate dielectric layer of the access transistor may be made thicker than the gate dielectric layer for the driver transistor. However, in this approach, a photoresist layer may need to contact the gate dielectric layer of the access transistor prior to forming the gate electrode for that transistor. This extra processing increases the likelihood that a particle will be formed between the gate dielectric and gate electrode. Further, the reliability of a device should be reduced when its gate dielectric layer has been exposed to a mobile-ion containing organic layer, such as photoresist.

In yet another attempt to improve the beta ratio, a higher channel-stop doping concentration can be used adjacent to the access transistors compared to the driver transistors. The increased doping level increases junction capacitance that may slow the speed of the memory cell. Also, the higher diffusion rate of the channel-stop dopant adjacent to the access transistors compared to the driver transistors may be small due to the low doping concentrations (less than 1E18 atoms per cubic centimeter).

SUMMARY OF THE INVENTION

Accordingly, it is an object of the present invention to provide a structure and process for making the structure that reduces SRAM bit cell instability.

It is another object of the present invention to provide SRAM bit cells with improved stability that do not require extra processing steps to fabricate.

The present invention includes an SRAM cell comprising an access transistor and a driver transistor. The planar access transistor has a first surface of a first channel region that lies along a first (100) crystal plane. The driver transistor is a vertical trench transistor, as defined herein, which has a second surface of a second channel region that lies along a second (100) crystal plane. The second (100) crystal plane is different from the first (100) crystal plane. Yet both planes belong to a single family and are considered equivalent crystal planes, i.e., {100}. The present invention also includes a process for forming such an SRAM cell.

In carrying out these and other objects of the invention, there is provided, in one form, a static-random-access memory (SRAM) cell having an access transistor having a first channel region with a first surface that lies along a first crystal plane; and a trench driver transistor having a second channel region with a second surface that lies along a second crystal plane, where the first and second crystal planes belong to a single family of equivalent crystal planes. The present invention also includes a process for forming the memory cell.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

Figure 1:
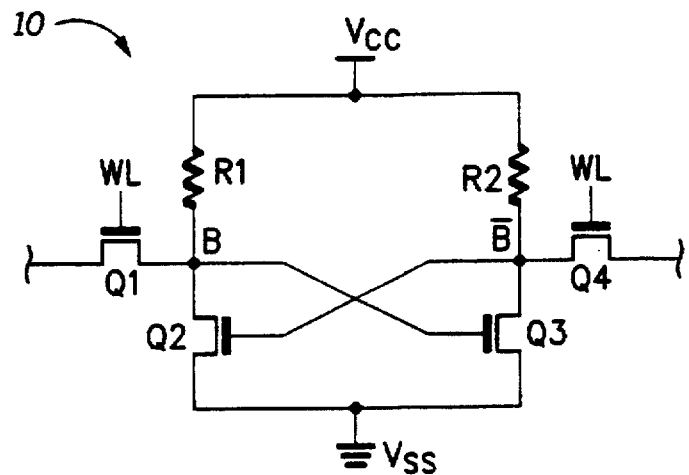
FIG. 1 is a schematic circuit diagram of a 4T-2R SRAM bit cell.

It will be appreciated that some of the Figures are not necessarily to scale, so as to illustrate important features of the invention.

DETAILED DESCRIPTION OF THE INVENTION

As discussed below, the invention herein involves aligning a surface of a trench MOSFET channel region along a (100) crystal plane unlike the related art that typically forms a surface of a trench channel region along a (110) crystal plane, which corresponds to a cleavage plane. The beta ratio for an SRAM cell is improved when a driver trench transistor has the surface of its channel region along a (100) crystal plane compared to a (110) crystal plane. This is because electron mobility is higher along a (100) crystal plane than on a (110) crystal plane. $G_m$ is proportional to electron mobility, and thus the beta ratio can be improved by increasing the $G_m$ of the driver transistor. However, for driver trench transistors to have the surfaces of its channel regions along a (100) crystal plane, the scribe lines of a semiconductor device including the SRAM cell are not along the conventional cleavage planes, or the SRAM cell is designed with some components oriented 45° or 135° with respect to other components. The former embodiment generally causes a subsequent sawing operation to be more difficult, and the latter embodiment occupies additional area. The present invention is better understood with the embodiments described in more detail below.

Before proceeding, some items are being defined to reduce the likelihood of confusion. A planar MOSFET is a transistor where a surface of the channel region of the transistor is generally parallel to the primary surface of the substrate. A vertical MOSFET is a transistor where a surface of the channel region of the transistor is generally perpendicular to the primary surface of the substrate. A trench MOSFET is a transistor where a surface of the channel region of the transistor is not parallel to the primary surface of the substrate and the channel region lies within the substrate. For a trench MOSFET, the surface of the channel region is usually perpendicular to the primary surface, although this is not required.

Crystal directions and crystal planes are familiar to those skilled in the art, but the notation of the crystal directions and planes can vary between references. As used in this specification, brackets denote a single crystal direction, carets denote a family of equivalent crystal directions, parentheses denote a single crystal plane, and braces denote a family of equivalent crystal planes. For example, [100], [010], [001], [1 00], [0 1 0] and [00 1] belong to the <100> family of equivalent crystal directions, and (100), (010), (001), (1 00), (0 1 0) and (00 1) belong to the {100} family of equivalent crystal planes. A bar over a "1" indicates −1. Each of the (100) crystal planes has an associated [100] crystal direction that is perpendicular to that plane.

Similarly, there are [110] crystal directions that belong to the <110> family of crystal directions and (110) crystal planes that belong to the {110} family crystal planes. Each of the (110) crystal planes has an associated [110] crystal direction that is perpendicular to that plane. Also, there are [111] crystal directions that belong to the <111> family of crystal directions and (111) crystal planes that belong to the {111} family crystal planes. Each of the (111) crystal planes has an associated [111] crystal direction that is perpendicular to that plane.

Figure 3:
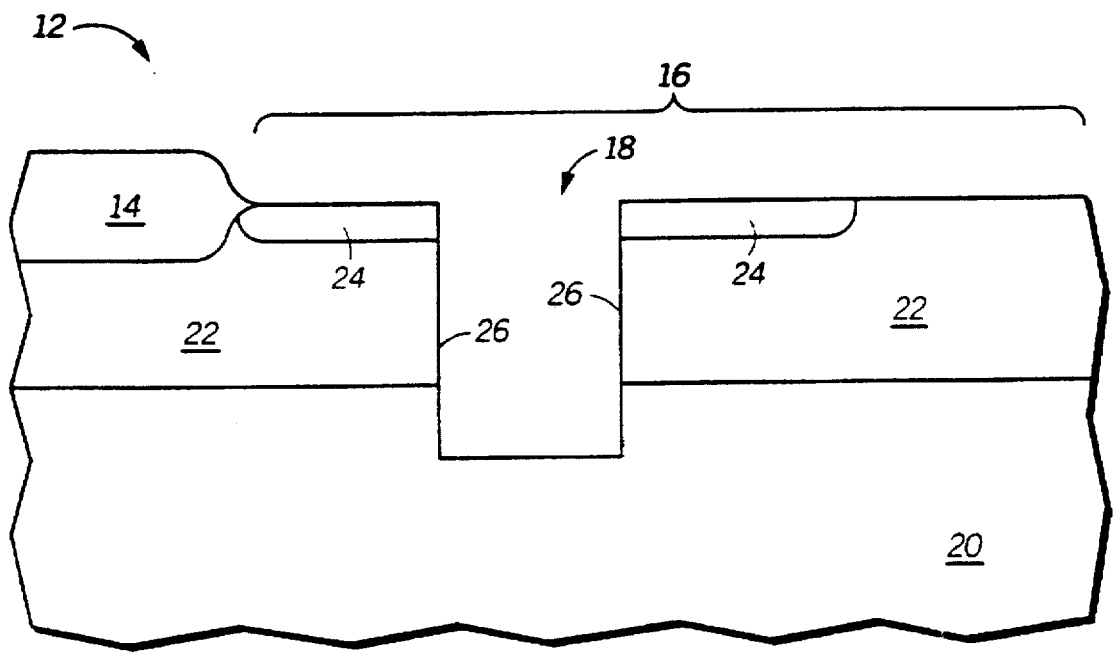
FIG. 3 is a cross sectional view of the cell in FIG. 2 along sectioning line 3—3 in FIG. 2.
Figure 2:
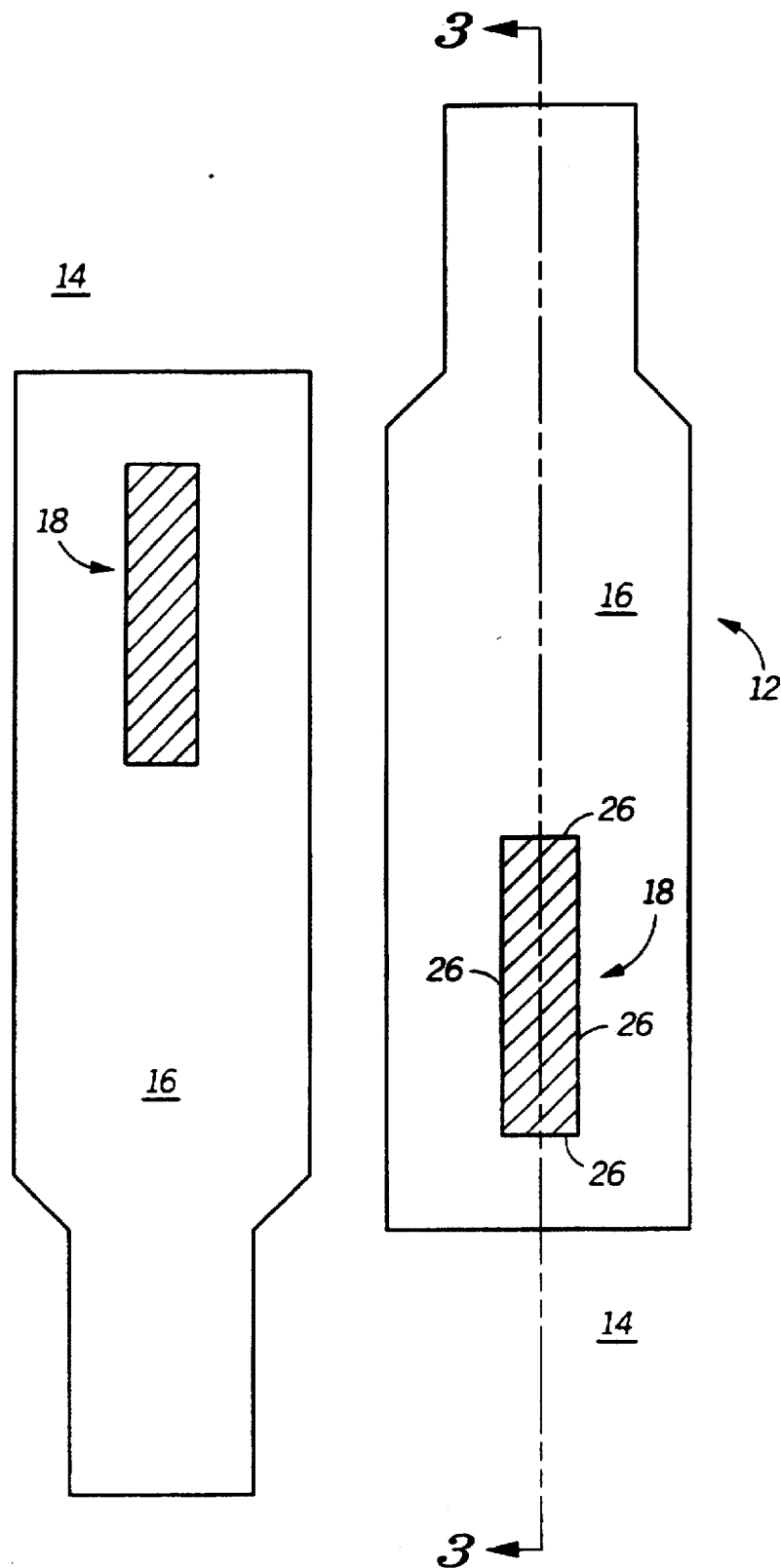
FIG. 2 is a plan view of a 4T-2R SRAM bit cell of this invention under construction after the trenches are formed in the active area.

Shown in FIG. 2 is a plan view of a 4T-2R SRAM bit cell 12 of this invention under construction on a (100) wafer where the scribe lines for all semiconductor devices including the cell 12 are not along the conventional cleavage planes, but are oriented at 45° or 135° thereto. In other words, the scribe lines are oriented in [100] crystal directions instead of the conventional [110] crystal directions. The 4T-2R SRAM bit cell 12 may be represented by the schematic 4T-2R SRAM bit cell 10 of FIG. 1. The 4T-2R SRAM bit cell 12 in FIG. 2 has field oxide 14 in which active regions 16 are formed which each have a trench 18 etched therein by conventional masking and trench etching processes. More detail is shown in FIG. 3 which is a cross-section of the cell 12 of FIG. 2 under construction taken along plane 3—3 of FIG. 2 showing field oxide 14 and active region 16, under which N+ buried layer 20 and p-well 22 were previously formed. Also prior to the etching of trench 18, n+ region 24 is formed which will be the drain of the vertical driver MOSFET where N+ buried layer 20 serves as the source. It is important to note that walls 26 of trench 18 will form the surfaces of the channel of the vertical driver MOSFET and lie along the {100} family of crystal planes. See also FIG. 2.

Figure 4:
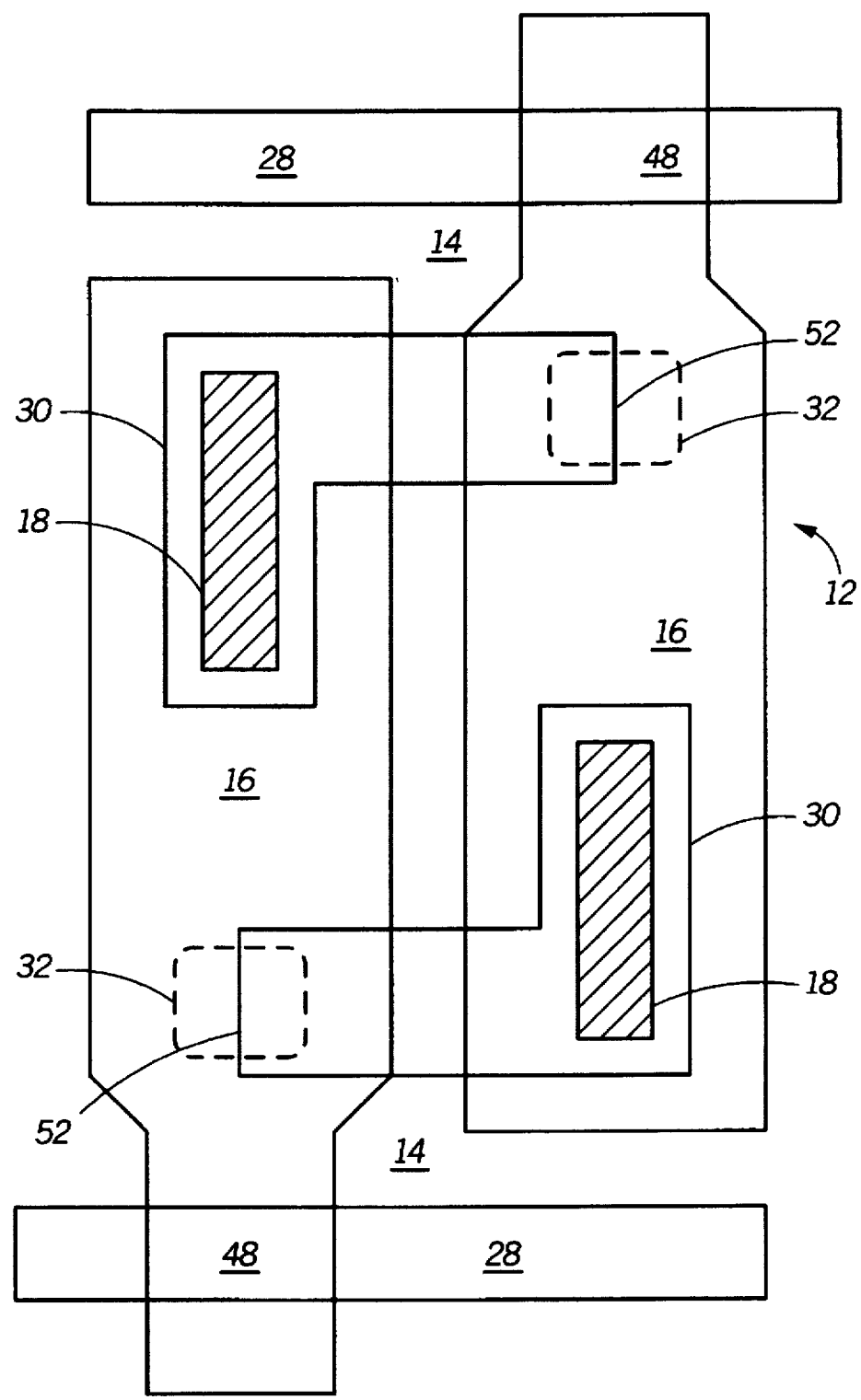
FIG. 4 is a plan view of the 4T-2R SRAM bit cell after forming the first polysilicon layer (word lines and driver gates)

Shown in FIG. 4 is a plan view of 4T-2R SRAM bit cell 12 from FIG. 2, after the first layer of polysilicon is formed and etched by conventional techniques to form word lines 28, latch gates 30, each of which will be configured to have a connection 52 at shared contact 32 with the adjacent half of cell 12. Access gates 48 are formed when the word lines 28 cross the active regions 16. Creation of the next polysilicon layer involves the formation and etch of a second layer of polysilicon 36 and subsequent masking and selective doping thereof to provide load resistor 34 which is connected to the first polysilicon layer at shared contact 32, as shown in FIG. 5.

Figure 5:
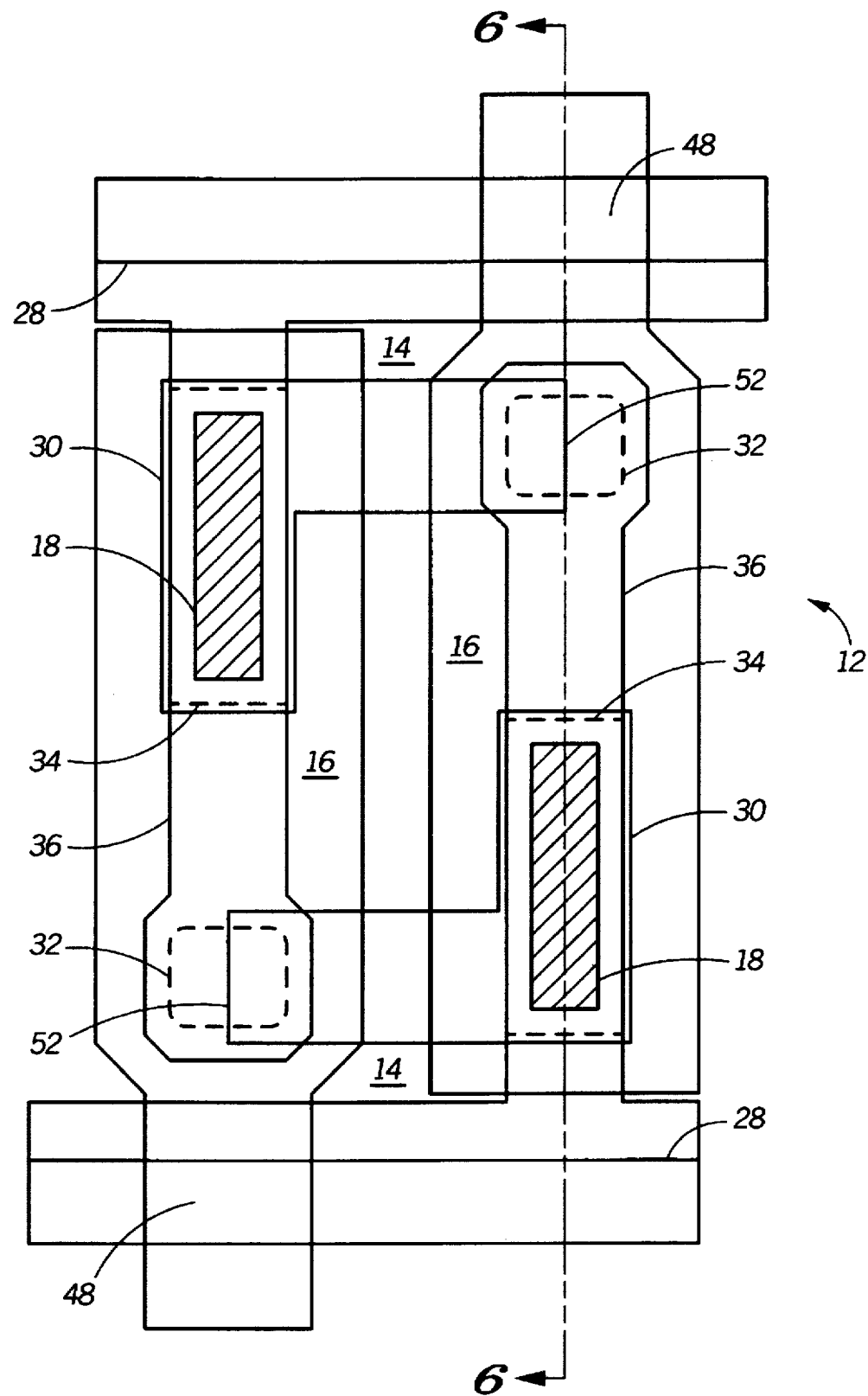
FIG. 5 is a plan view of the 4T-2R SRAM bit cell after forming the second polysilicon layer (load resistors)
Figure 6:
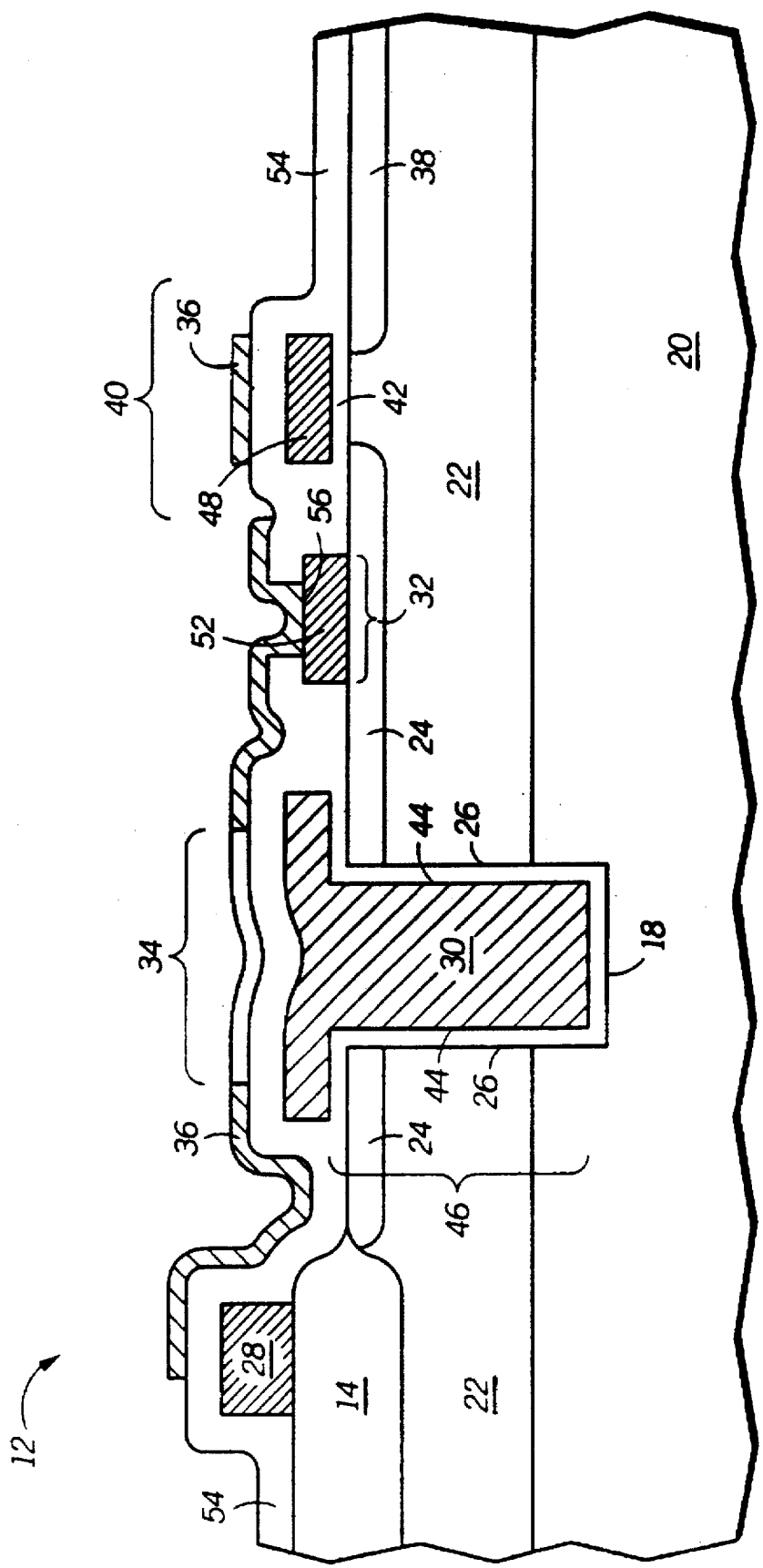
FIG. 6 is a cross sectional view along the same plane 6—6 of FIG. 5 after the load resistors are formed.

The 4T-2R SRAM bit cell 12 in the stage of construction in FIG. 5 is shown in cross-section in FIG. 6 in more detail and comparison is invited to the FIG. 3 cross-section from which discussion continues. A gate dielectric layer, which may be silicon dioxide, is next provided to form gate oxide 42 for planar access transistor 40 and gate oxide 44 for trench driver transistor 46. Preferably, gate oxide layers 42 and 44 are formed in one step, however, the inventive process contemplates that separate steps may be required so that gate oxides 42 and 44 will be the proper thicknesses. This silicon dioxide layer is etched through at shared contact region 32 prior to the formation of the first conductive layer, which may be n-doped polysilicon. This first n-doped polysilicon layer (poly 1) may then be formed and etched to give word lines 28, latch gate 30 and poly 1 contact 52 from the other, adjacent driver transistor to shared contact 32. Again access gates 48 are formed where the word line 28 cross the active regions 16. The n+ regions 38, which will serve as source/drains for planar access transistor 40 during operation of cell 12, are formed, for example by ion implantation, after the formation of the poly 1 features. Silicon dioxide layer 54 or other dielectric is then placed over the cell 12 and patterned to leave opening 56 over shared contact region 32. A second polysilicon layer 36, which again may be n+ doped polysilicon (poly 2) is provided, patterned and etched. This second conductive layer 36 may be deposited undoped, may be lightly doped in situ, or may be lightly doped in its entirely, for example in a blanket implant or other step. The etched poly 2 lines 36 then has a middle portion that is masked and the remainder or ends thereof (illustrated by hatching lines within layer 36) are selectively more heavily doped using conventional techniques so that the masked portion thereof is undoped (or only lightly doped) polysilicon to form load resistor 34.

Figure 7:
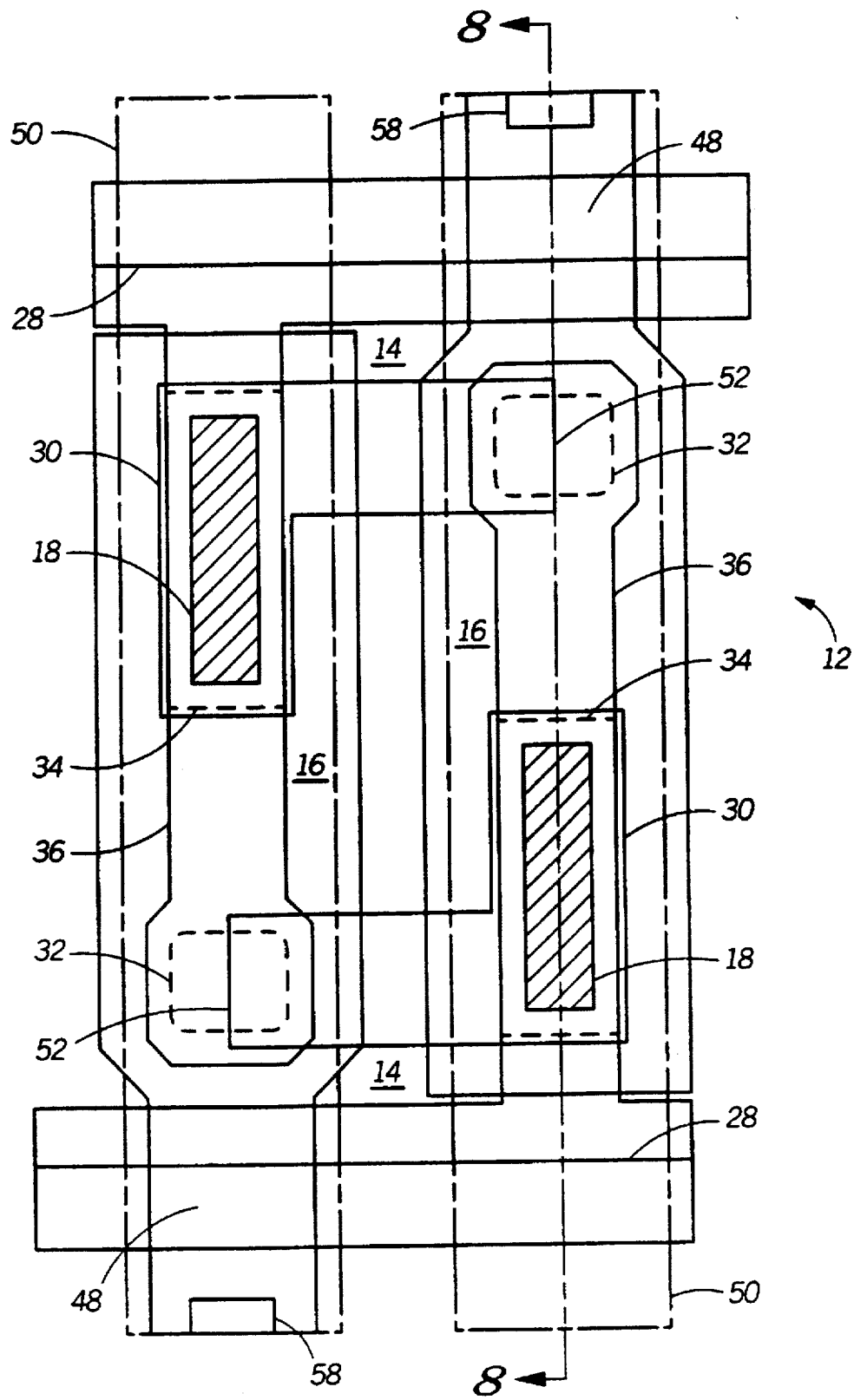
FIG. 7 is a plan view of the 4T-2R SRAM bit cell after forming the first metal layer.
Figure 8:
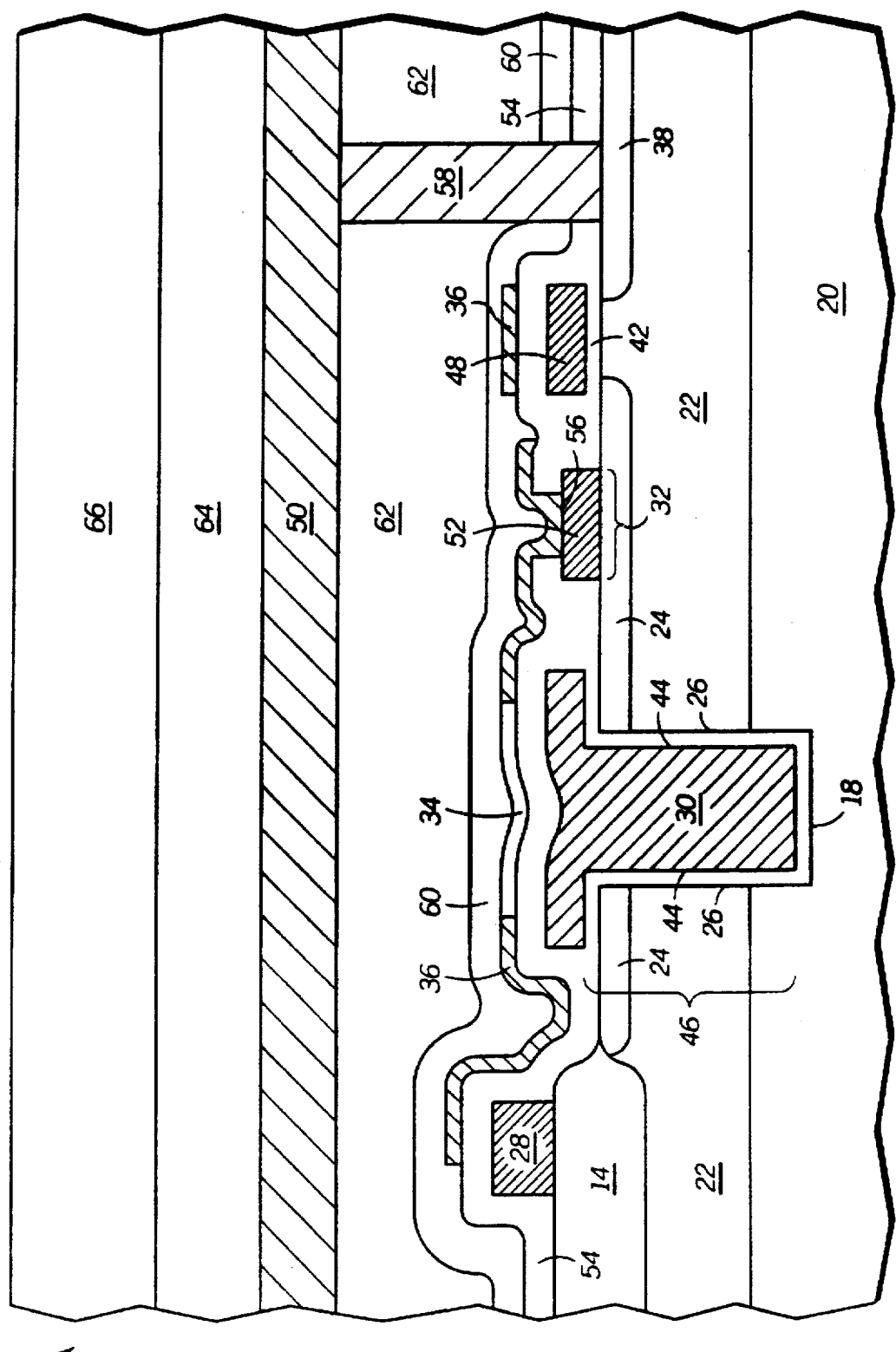
FIG. 8 is a cross sectional view along the same plane 8—8 of FIG. 7 after forming a substantially completed device including bit lines and a passivation layer.

Shown further in FIG. 7 is the final plan view of 4T-2R SRAM bit cell 12 under construction oriented as in FIG. 5 with all the features shown therein, to which metal lines 50 have been added to provide contact 58 to n+ source/drain region 38 of planar access transistor 40 as more clearly shown in the FIG. 8 cross-section along plane 8—8 of FIG. 7.

The FIG. 8 cross-section shows the finished the conductive regions of 4T-2R SRAM bit cell 12 having all of the FIG. 5 features in the previous cross-section of FIG. 6 with the further addition of dielectric layer 60, which may be silicon dioxide or other suitable material, and dielectric planarization layer 62 which may be boro-phosphosilicate glass (BPSG) or spin-on glass (SOG), or other suitable material. The cell 12 is then patterned and etched to provide metal contact 58, which may be tungsten or other suitable material, and which is further interconnected to metal line 50, which may be aluminum or other suitable material. It will be appreciated that there are various known ways to make these interconnections, which may include the use of barrier metal layers (not shown), and the invention is not limited to any particularly process sequence for these or other structures. After metal line 50 is provided, passivation layer 64 and then additional protective layer 66, such as polyimide or other suitable material, is added to the finished 4T-2R SRAM bit cell 12.

Figure 9:
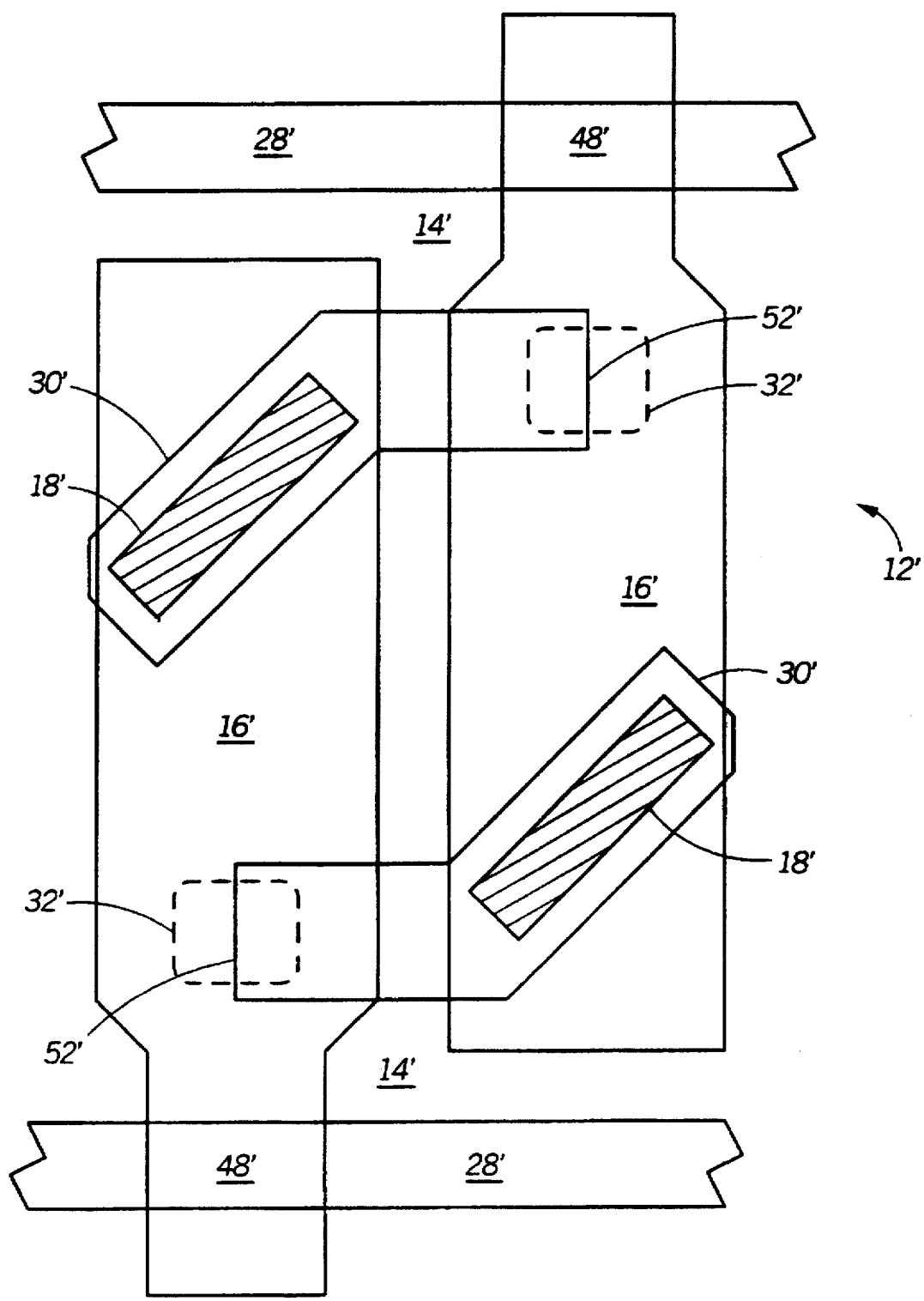
FIG. 9 is a plan view of an alternative embodiment 4T-2R SRAM bit cell at a point in processing similar to FIG. 4. In the FIG. 9 embodiment, the trenches alone are oriented at 45° relative to the balance of the cell on a conventionally configured wafer to align the surfaces of the trench driver channels to the {100} family of equivalent planes.

Finally, shown in FIG. 9 is a plan view of an alternate embodiment of the 4T-2R bit cell 12' at a point in construction similar to the plan view in FIG. 4. However, in the FIG. 9 embodiment, the bulk of the features of the bit cell 12' is oriented along the cleavage planes of the wafer, as in conventional wafers. However, the trenches 18' and the latch gates 30' filling the trenches 18' are oriented 45° and 135° relative to the balance of the cell to align the surfaces of the trench driver channels to the {100} family of equivalent planes. Other features with like reference numbers correspond to the same features as in the plan view of FIG. 4.

It will be appreciated further that in another alternate embodiment of the invention, a (110) substrate, rather than a conventional (100) substrate may be used together with trench driver transistors having channel regions with surfaces in the {100} family of equivalent planes. It is expected that such a configuration would produce a better SRAM bit cell.

Further it will be understood that the invention may be applied to 6-T SRAM bit cells. In such a layout, the polysilicon for the channel regions for the two load transistors would be formed at a location similar to that of the load resistors shown in FIGS. 3–8. In such a 6-T SRAM cell, the load transistors may be overgated or undergated.

It has been discovered that the current drive of MOSFETs can be enhanced by ensuring that the channel regions are located on a (100) plane rather than a (110) plane. Locating the surfaces of the channel regions on a (100) plane provides increased current drive ($^I$D,SAT) relative to a (110) plane.

In the embodiments disclosed, the driver transistors have surfaces of their channel regions along {100} crystal planes of a trench. An SRAM bit cell with these transistors should have a higher β ratio compared to an SRAM bit cell with trench driver transistors having surfaces of their channel regions along (110) crystal planes. As explained, this is due to the higher electron mobility along channel surfaces in the {100} crystal planes. The invention allows a lower potential to be used for $V_{cc}$ (i.e., 3.3 volts, in one non-limiting embodiment) without causing read disturb errors. Further, the orientation of the trench driver transistors of the invention simultaneously enhances cell capacitance without degrading cell stability.

Because the prior art does not address the interaction of multiple device cells and the problems involved in matching their characteristics, the idea of matching the characteristics of the access and driver transistors in a cell is not taught or suggested by the literature. The improvement in β ratio and stability of the cell is not an issue unless more than one transistor and its relation to another transistor is considered, as here.

In the foregoing specification, the invention has been described with reference to specific embodiments thereof. However, it will be evident that various modifications and changes can be made thereto without departing from the broader spirit or scope of the invention as set forth in the appended claims. Accordingly, the specification and drawings are to be regarded in an illustrative rather than a restrictive sense.

We claim:

1. A static-random-access memory (SRAM) cell comprising:

a monocrystalline semiconductor region;

a planar access transistor having a first channel region with a first surface that lies along a crystal plane of a {110} family of crystal planes, wherein:

the first channel region lies within the monocrystalline semiconductor region; and the first channel region has a first channel length that extends in a first direction: and a trench driver transistor having a gate electrode and a second channel region with a second surface that lies along a crystal plane of a {100} family of crystal planes, wherein:

the second channel region lies within the monocrystalline semiconductor region;

the trench driver transistor at least partially lies within a trench having opposing sides that extend in a second direction and a third direction that is substantially parallel to the second direction;

the first and second directions form an angle of approximately 45 or 135 degrees; and the second surface is vertical.

2. The SRAM cell of claim 1 further comprising a load resistor having a resistive portion that overlies the gate electrode of the trench driver transistor.

3. The SRAM cell of claim 1 where the monocrystalline semiconductor region is a (110) substrate.

4. The SRAM cell of claim 1, wherein the trench driver transistor has a source and at least partially lies within a trench having a bottom surface that completely lies within the source.

5. A process for forming a static-random-access memory (SRAM) cell comprising the steps of:

providing a monocrystalline semiconductor region;

forming a planar access transistor having a first channel region with a first surface that lies along a crystal plane of a {110} family of crystal planes, wherein:

the first channel region lies within the monocrystalline semiconductor region; and the first channel region has a first channel length that extends in a first direction; and forming a trench driver transistor having a gate electrode a second channel region with a second surface that lies along a crystal plane of a {100} family of crystal planes, wherein:

the second channel region lies within the monocrystalline semiconductor region;

a step of forming the trench driver transistor includes a step of forming a trench having opposing sides that extend in a second direction and a third direction that is substantially parallel to the second direction;

the first and second directions form an angle of approximately 45 or 135 degrees; and the second surface is vertical.

6. The process of claim 5 further comprising a step of forming a load resistor having a resistive portion that overlies the gate electrode of the trench driver transistor.

7. The process of claim 5 where the monocrystalline semiconductor region is a (110) substrate.

8. The process of claim 5, wherein the step of forming the trench driver transistor is performed so that the trench driver transistor has a source and at least partially lies within a trench having a bottom surface that completely lies within the source.

* * * * *